United States Patent [19]
Gobert

[11] Patent Number: 5,608,844
[45] Date of Patent: Mar. 4, 1997

[54] NEURAL PROCESSOR COMPRISING DISTRIBUTED SYNAPTIC CELLS

[75] Inventor: Jean Gobert, Mabons-Alfort, France

[73] Assignee: U.S. Philips Corporation, New York, N.Y.

[21] Appl. No.: 487,617

[22] Filed: Jun. 7, 1995

Related U.S. Application Data

[62] Division of Ser. No. 405,567, Mar. 16, 1995, which is a continuation of Ser. No. 23,548, Feb. 26, 1993, abandoned.

[30] Foreign Application Priority Data

Feb. 26, 1992 [FR] France ................................. 92 02250

[51] Int. Cl.⁶ ........................... G11C 13/00; G06F 15/18
[52] U.S. Cl. ................................. 395/27; 395/22; 395/24
[58] Field of Search ........................... 395/27, 24, 22

[56] References Cited

U.S. PATENT DOCUMENTS

| | | | |
|---|---|---|---|
| 4,994,982 | 2/1991 | Duranton et al. | 395/27 |
| 5,005,206 | 4/1991 | Naillon et al. | 395/22 |
| 5,075,889 | 12/1991 | Jousselin et al. | 395/27 |
| 5,134,396 | 7/1992 | Sirat et al. | 395/22 |
| 5,151,971 | 9/1992 | Jousselin et al. | 395/27 |
| 5,201,029 | 4/1993 | Jackson et al. | 395/27 |
| 5,241,509 | 8/1993 | Jousselin et al. | 395/27 |
| 5,293,459 | 3/1994 | Duranton et al. | 395/27 |

OTHER PUBLICATIONS

Yasunaga et al, "A Wafer Integration Neural Network Utilizing Completely Digital Circuits", IJCNN, IEEE 1989.

Primary Examiner—George B. Davis
Attorney, Agent, or Firm—Debra K. Stephens

[57] ABSTRACT

The neural net has a physical topology independent of its functional topology. Cells, being functional equivalents of synapses, are concatenated to form a unidirectional data path. The cells are connected in parallel to a bus for individual or parallel control The respective synapses contributions to a neuron potential are individually calculated in each respective cell involved. Each cell in the concatenation either is rendered transparent or adds its contribution to the data received from the preceding cell and supplies this sum to the next cell. Preferably, the allocation of the synapses to the cells is programmable.

9 Claims, 6 Drawing Sheets

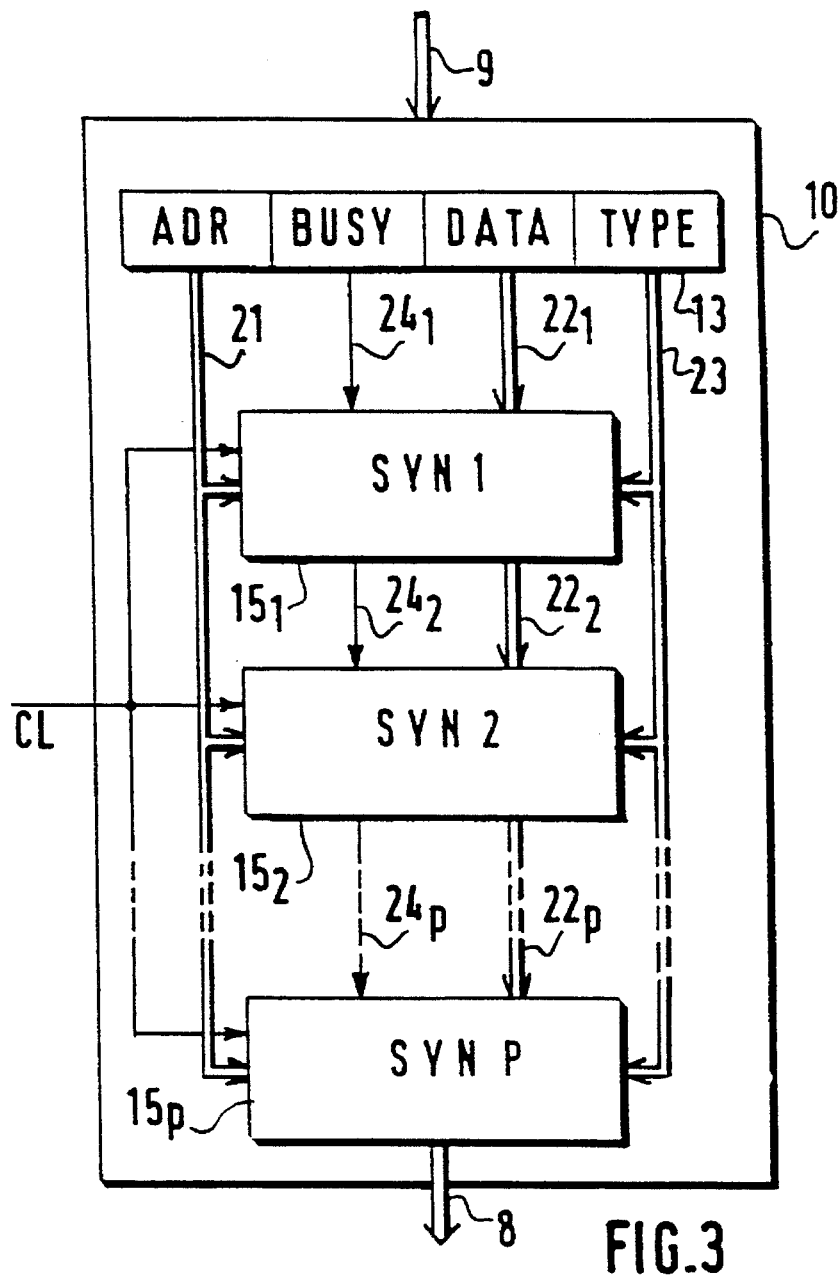
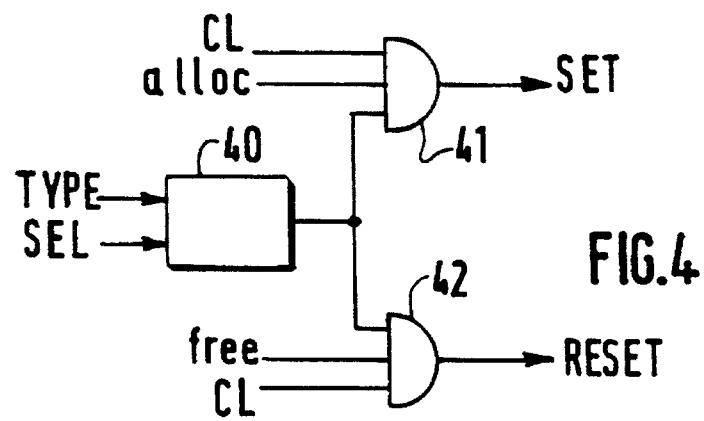

NEURAL PROCESSOR COMPRISING DISTRIBUTED SYNAPTIC CELLS

This is a division of application Ser. No. 08/405,567, filed on Mar. 16, 1995, which is a continuation of application Ser. No. 8/023,548, filed Feb. 26, 1993, now abandoned.

FIELD OF THE INVENTION

The invention relates to a neural net within a neural processor operating to realize the function of neurons and including neurons interconnected by respective synapses for data communication between a respective source neuron and a respective destination neuron.

BACKGROUND OF THE INVENTION

Regardless of whether neural nets are simple or complex, they generally comprise a number of resources which can be grouped around three functions:

storage: this function concerns on the one hand the storage of synaptic coefficients characterizing synapses interconnecting two neurons and on the other hand the storage of functional states of the neurons, interconnection: this function concerns the allocation of one neuron to another neuron for the transmission and/or exchange of different control signals and data signals, processing: this function concerns the calculation of various data, notably the calculation of neural potentials of the neurons and the calculation of the updating of synaptic coefficients during the learning steps.

In conformity with the most common prior art, a neural processor comprises a storage unit which, generally speaking, stores all synaptic coefficients, each synaptic coefficient being accessed by an address in the storage unit. The interconnection function is thus implicitly obtained by wiring according to rank (the addresses) of the synaptic coefficients in the storage unit: all synaptic coefficients of the same neuron are stored at known addresses (which are generally logically adjacent) so that it suffices to increment/decrement an address so as to render said synaptic coefficients available.

The resources allocated to the synapses in this case represent only the storage section, and the other functions must be executed in the processing unit. In order to obtain an advantage over pure software implementations, it is necessary to utilize some degree of parallelism; to this end, the processing unit actually consists of n processing sub-units, each of which performs 1/n of the operations of the network. In order to limit the number of physical interconnections, a sub-unit is rigidly connected to 1/n of the synaptic memory.

For the same reasons as stated to limit the number of interconnections, a sub-unit may not be engaged in processing for arbitrary neurons, independently of the synapses involved. The subdivision of the network into sub-units thus introduces relations between the synapses contained in a memory section and the neurons concerned by these synapses. For example, the number of synapses arriving at a given neuron may not exceed the length of a memory block assigned to a sub-unit.

This results in a poor efficiency of the use of the hardware. In order to simplify control, the number of calculation cycles of the sub-units is raised to the maximum number necessary for the most complex configuration permitted by the device. Moreover, given memory words will not be used because they relate to blocks corresponding to neurons having few synapses.

Attempts have been made to optimize the processing durations and to improve the proportioning of the hardware for various situations encountered.

In this respect reference is made to the document: "A wafer scale integration neural network utilizing completely digital circuits" by M. Yasunaga et at., IEEE INNS International Joint Conf. on Neural Networks II-213 (1989).

Referring only to the part considered relevant to the present invention, the cited paper describes a reduction of the number of interconnections arriving at the same neuron. To this end, the architecture is subdivided into neurons, a neuron then being a block receiving a single synapse at a given instant. From a shared bus this block successively receives, in time distribution, data relating to all synapses arriving at this neuron.

Thus, there are as many processing units and storage units as there are neurons. For the same neuron, a small memory stores all synaptic coefficients relating to this neuron. They are sequentially addressed as in the case of a non-distributed architecture. This mode of operation enables a reduction of the number of interconnections arriving at a neuron.

However, such an architecture remains rigid; specifically, it is not possible to modify, one unit after the other, the number of synapses connected to a neuron. Thus, this does not offer flexibility for attributing a new synapse distribution configuration to the neural processor.

The subdivision of the memory into modules which are accessible in order to execute the operations on the synapses thus imposes restrictions as regards the topology of the network. As a result, a network having an arbitrary topology, defined by a group of neurons and their interconnections, cannot always be accommodated on the hardware device, even if the total number of neurons and synapses is lower than the number that could be theoretically handled by the system.

OBJECT OF THE INVENTION

Therefore, it is an object of the invention to provide a neural net wherein a functional arrangement of the net's functional elements is independent of a physical arrangement thereof. To this end, it is desirable to remove the restriction linked to a fixed number of synapses per neuron in order to avoid either non-use of resources which become useless when a neuron has few synapses, or imposition of a maximum number of synapses per neuron which would be too restrictive.

SUMMARY OF THE INVENTION

To this end, the invention provides:
a neural net within a neural processor functionally comprised of neurons interconnected by respective synapses for data communication between a respective source neuron and a respective destination neuron;
  characterized in that:
  the respective synapses are physically organized in at least one concatenation of respective uniform cells forming a data path between an entry and an exit, wherein a data input of each next one of the cells is connected to a data output of a preceding one of the cells for data transfer;
  each cell comprises between the data input and the data output:

a calculation unit operative to perform a data calculation;

a memory coupled to the calculation unit and operative to store data;

the neural processor comprises a bus means for communication of an instruction;

the cells being connected in parallel to the bus means;

the neural net comprises:

a control means for supplying the instruction to control the cells via the bus means in order to select at least one particular one of the cells for at least one of following operations:

loading a data item provided at the entry to the memory of the particular cell;

controlling the calculation unit of the at least one particular cell to create a product by multiplying the data item by a particular synaptic coefficient and storing the product in the memory of the at least one particular cell;

successively accumulating the products produced in a plurality of selected cells by transferring a preceding partial sum of products of preceding selected cells to a next one of the selected cells, adding the product stored in the memory of the next one of the selected cells to the preceding partial sum to create a next partial sum and providing the next partial sum to the data output of the next selected cell, the non-selected cells being rendered transparent; and the neural net comprises:

a non-linear transformation means connected to the exit for applying a non-linear function to an aggregate sum provided at the exit in order to create a destination neuron output signal.

The architecture according to the invention has a variety of advantages over the prior art. First the network's physical topology is rendered independent of the net's functional topology by using instruction control. Each cell can also be individually selected, e.g., to load each cell with a relevant synapse coefficient, or a data item representing an input value to a neuron. Cells can be selected in parallel, e.g. to simultaneously calculate the contribution of each of the relevant synapses, given the input value. Non-selected cells will be rendered transparent. Accordingly, a variety of neural nets, mutually differing with regard to network topology and the number of neurons, can easily be implemented. Second, the architecture has a highly modular character, as its basic structure is a concatenation of uniform cells forming a unidirectional data path between the entry and the exit. This modularity is a desirable characteristic in view of designing such a net, for instance as an integrated circuit. Also, interaction between cells only relates to physically adjacent cells, thereby avoiding cumbersome interconnections between physically remote parts. Third, such neural processor focusing a unidirectional data path can easily be extended by means of cascading a plurality of neural processors.

All these advantages are achieved by distributing the synaptic functionalities and the accumulation functionality of the destination neurons over the one-dimensional data path.

Prior to the calculation of a destination neuron's potential, data items are loaded in the relevant source neurons. The data items may be the output values of the source neurons to be transmitted to the destination neuron, the synaptic coefficients or both. This loading is accomplished serially. A subsequent calculation of the contributions of each relevant synapse, i.e. the multiplication of the data by the synaptic coefficients, is performed in parallel. Thereupon, the contributions are summed by successively forming the partial sums when the contributions propagate along the data path.

Preferably, the synapses are physically organized in said first concatenation, operative to produce the aggregate sum and at least one further concatenation, operative to produce a further aggregate sum and functionally arranged in parallel to the first concatenation; and the neural processor comprises an adding means between the concatenation and the further concatenation on the one hand and the exit on the other hand to linearly combine the aggregate sum and the further aggregate sum prior to applying the non-linear function.

This set-up of parallel data paths reduces operation time. As data propagation is similar to that of pipeline processors, the data path can be divided by so-called pipe line barriers at strategic positions in order to allow synchronizing.

Addressing of the cells via the bus means preferably is done in at least two modes: individually and in parallel with regard to the shared destination neuron. The first mode is advantageous for individually modifying the data contents of a single cell, e.g. the source neuron state or the synaptic coefficient, whereas the second mode is highly advantageous to realize a plurality of independent calculations, e.g. the contributions of each synapse to the neuron potential of the destination neuron. Note that the same scheme can be applied in a learning phase, e.g. using error backpropagation. To this end it is advantageous to form an address consisting of a first identifier, and a second identifier to identify a particular synapse by its source neuron and its destination neuron.

In view of hardware savings, a neural net according to the invention advantageously includes in each cell calculation unit which comprises an adder and register coupled between an input and an output of the adder, the calculation unit being operative to selectively perform iterative additions to create the product and preferably the calculation unit of the next cell is selectively operative to create the next partial sum.

The above aspects of the invention and other aspects will become apparent from and will be illustrated with respect to the embodiments described hereinafter.

BRIEF DESCRIPTION OF THE DRAWINGS

The invention will be better understood on the basis of the following Figures which are given by way of non-limitative examples; therein:

FIG. 3 shows a general diagram of a neural processor in accordance with the invention, subdivided into a plurality of synaptic cells.

FIG. 4 shows a diagram of an allocation circuit for writing in an allocation module.

DESCRIPTION OF EMBODIMENTS

Figure 1:
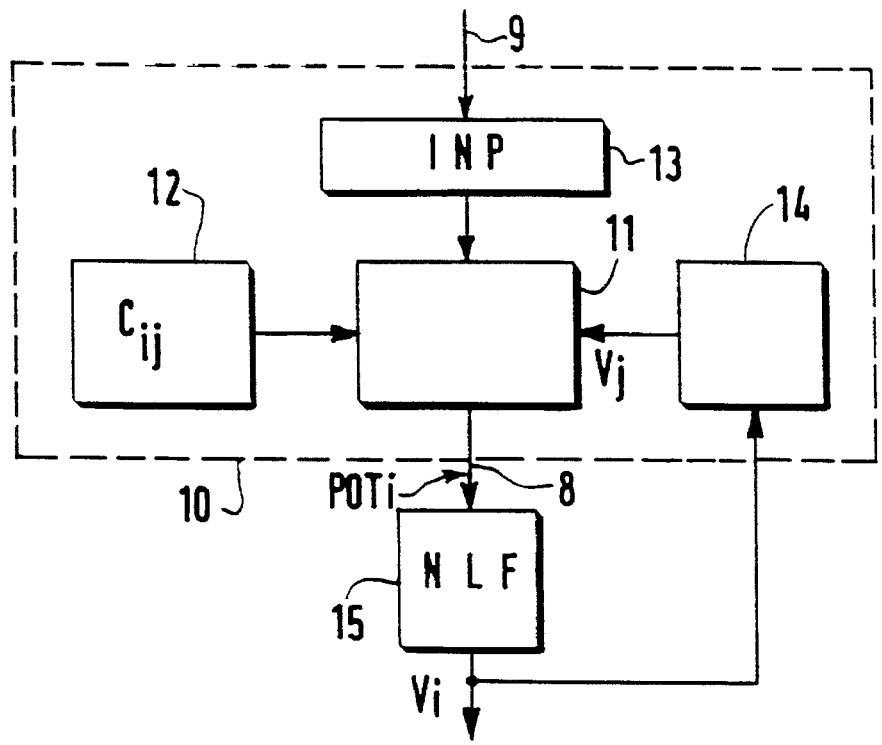
FIG. 1 shows a general diagram of the essential elements of a known neural processor.

FIG. 1 shows a simplified diagram of an architecture of a known neural processor 10. Input means INP 13 (for example, input registers or input terminals) apply data 9 to a processing unit 11 which also receives synaptic coefficients $C_{ij}$ stored in storage means 12. A synaptic coefficient $C_{ij}$ characterizes the weight of the synapses which connects a source neuron j to a destination neuron i. The processing unit 11 also receives neuron states stored in storage means 14.

When a neuron operates as a source neuron, its state is denoted by $V_j$ and when it operates as a destination neuron, its state is denoted by $V_i$. The processing unit 1 performs calculations for each destination neuron to calculate it's neural potential:

$$POT_i = \sum_i \cdot C_{ij} \cdot V_i$$

The processing unit 11 performs the summing operation for all source neurons having the index j and outputs (connection 8) the neural potential $POT_i$ of the destination neuron i. This neural potential $POT_i$ is subjected to a non-linear function NLF 75 which produces the new neuron state $V_i$ of the destination neuron i. This new state $V_i$ is used to update the storage means 14 and the process continues for other neurons. The means 15 for applying the non-linear function NLF are shown to be situated outside the neural processor 10. FIG. 1 merely illustrates the architecture, because these means 15 may also be included in the neural processor 10. For the sake of simplification, other members have been omitted: control means (for example, a host computer), learning means, etc.

The architecture of FIG. 1 is represented in the form of functional blocks, each block being associated with a unique function: storage of synaptic coefficients, storage of neuron states, processing, . . . . In order to reduce the number of interconnections, an architecture can be conceived which is subdivided into modular blocks as already described in the cited article by M. Yasunaga et al. In that case, a modular block concerns a single neuron, said modular block being "fed" by all data of all synapses relating to this modular block.

The invention goes even beyond this concept by defining an architecture broken down to the level of the synapses themselves and by defining the communications between the synapses, regardless of their assignment to any one of the neurons and their ranking in the chains of synapses.

PRINCIPAL EMBODIMENT

The general diagram of FIG. 3 represents a principal embodiment of the neural processor (10) in accordance with the invention. The neural processor 10 comprises input means 13 (for example, input registers or input terminals) which receive several instruction fields from the environment:

ADR: an address field
BUSY: a busy signal
DATA: a data field
TYPE: a field with the type of operations to be performed on the data.

A combination of all these data fields constitutes an instruction. The circuit is rendered active by successively presenting sequences of instructions. The principal instructions are specified in Table I. This Table indicates the composition of the field DATA for given instructions. For example, when the operation type indicates a synapse management step, the field DATA will contain a bit alloc which, when it has the logic state 1, determines the instruction "allocation of synapse". In that case, the field DATA also contains a data field which is called "data" on which the operations are to be performed. When the field TYPE indicates an accumulation operation, the entire field DATA is devoted to the information contents "data". The other instructions of the Table I should be read in a similar manner.

TABLE I

| TYPE | DATA | | INSTRUCTIONS |
|---|---|---|---|
| synapses management | 1 bit alloc ; if alloc = 1 | data | Allocation of synapses |
| | 1 bit free; if free = 1 | — | Liberation of synapse |
| reading/ writing | 1 bit read; if read = 1 | — | Reading of synaptic coefficient |
| | 1 or several bits write | data | Writing of registers (SN, DN, CV or M) |
| Accumulation | data | | Accumulation |
| Operation | multi = 1 1 to 7 other bits used to specify the operation | — | Multiplication |
| | multi = 0 7 bits used to specify the operation | — | Other internal operations |

The architecture of the neural processor is comprised of synaptic cells SYN 1, SYN 2, . . . , SYN P. All synaptic cells have an identical structure. Generally speaking, communication is accomplished in two different ways:

they all receive in parallel:
the address field ADR distributed in parallel by the bus 21,
and the operation type field TYPE distributed in parallel by the bus 23,
they communicate in a concatenated manner:
via a concatenated path DATA $22_1$, $22_2$, . . . , $22_p$,
and via a concatenated path BUSY $24_1$, $24_2$, . . . , $24_p$.

The last synaptic cell SYN P of the chain provides operation results to the bus 8, for example neural potential calculations. Moreover, a clock signal CL is applied to all synapses.

Figure 2:
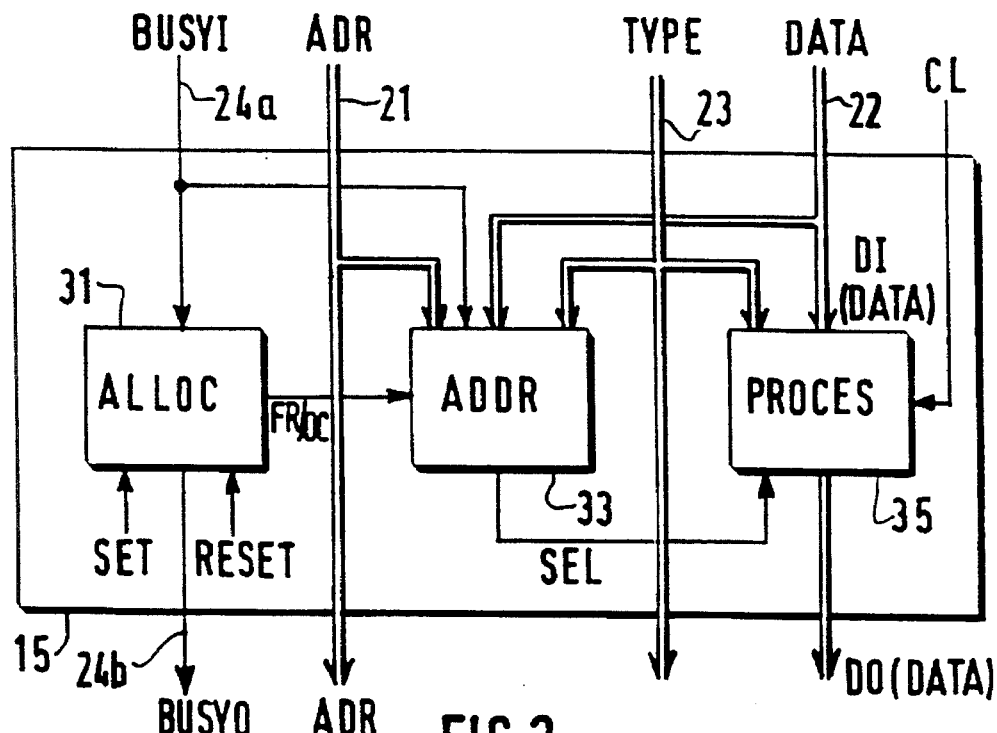
FIG. 2 shows a general diagram of a synaptic cell in accordance with the invention.

All synaptic cells have a uniform architecture. A synaptic cell 15 is shown in FIG. 2. It comprises:
allocation ALLOC means 31,
addressing means ADDR 33,
processing means PROCES 35.

The allocation means ALLOC 31 receive a signal BUSY I from a preceding synaptic cell at their input and output on the one hand a busy signal BUSY 0 to a next synaptic cell and on the other hand a signal FR/OC to the addressing means ADDR 33, indicating a free state FR or busy state OC of the synaptic cell.

When a current address ADR is transmitted on the address bus 21, during operation of the allocated synaptic cells, the addressing means 33 activate a signal SEL when the address allocated to the synaptic cell and the current address are identical. The signal SEL then triggers the processing means PROCES 35 so that they execute the operations whose type is determined by the field TYPE. These operations are performed on the input data DI, that is to say the data "data" contained in the data field DATA. After processing, these input data DI produce the output data DO.

When the address allocated to the synaptic cell and the current address are not the same, the synaptic cell is not involved and restricts itself to the transfer of an output data field DO, being identical to the input data field DI to the next synaptic cell.

Figure 5:
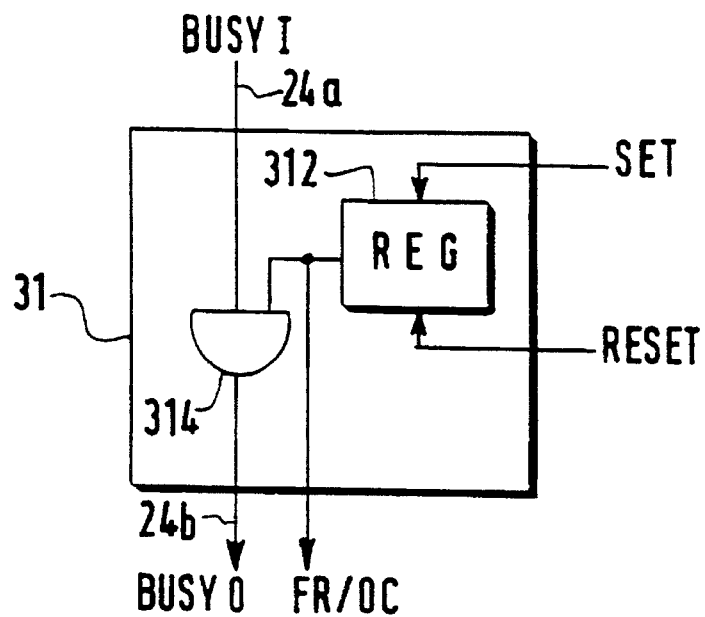
FIG. 5 shows a diagram of an allocation module.
Figure 6:
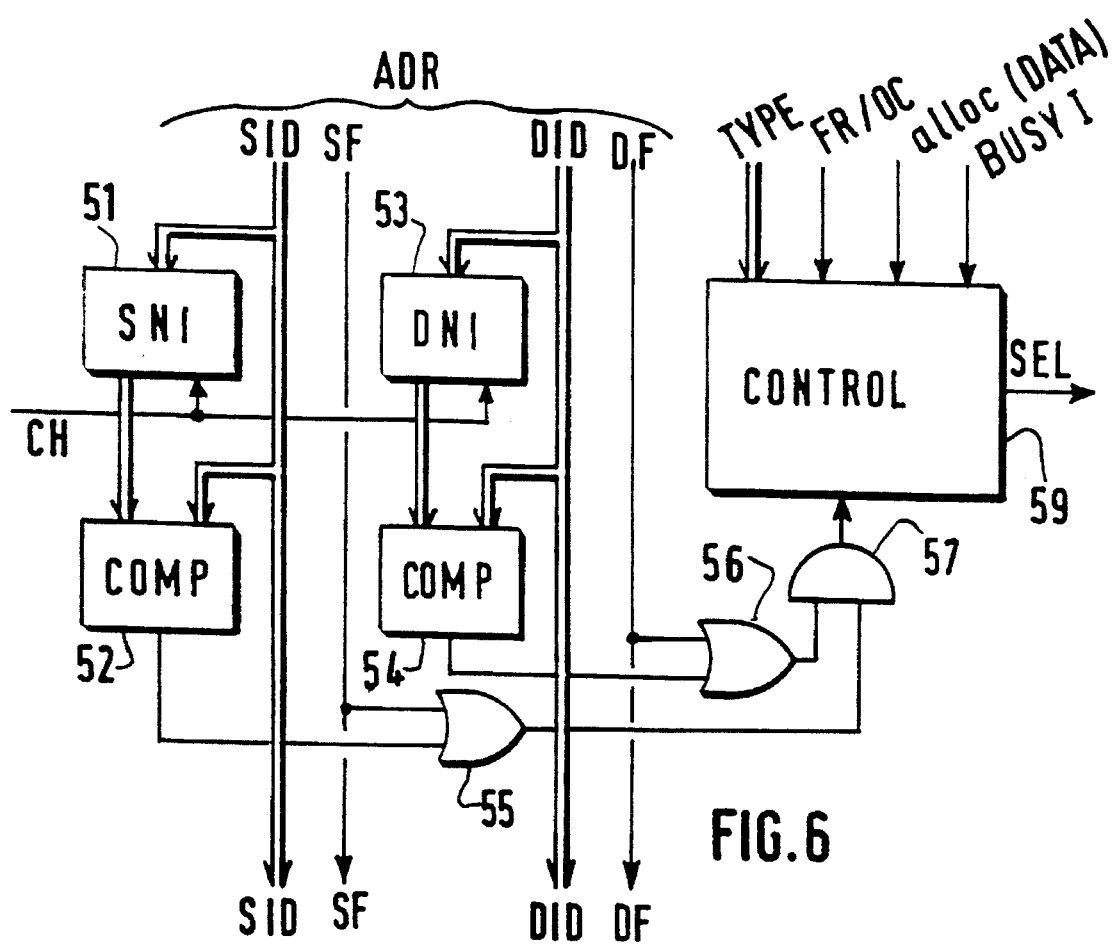
FIG. 6 shows a diagram of an addressing module.
Figure 7:
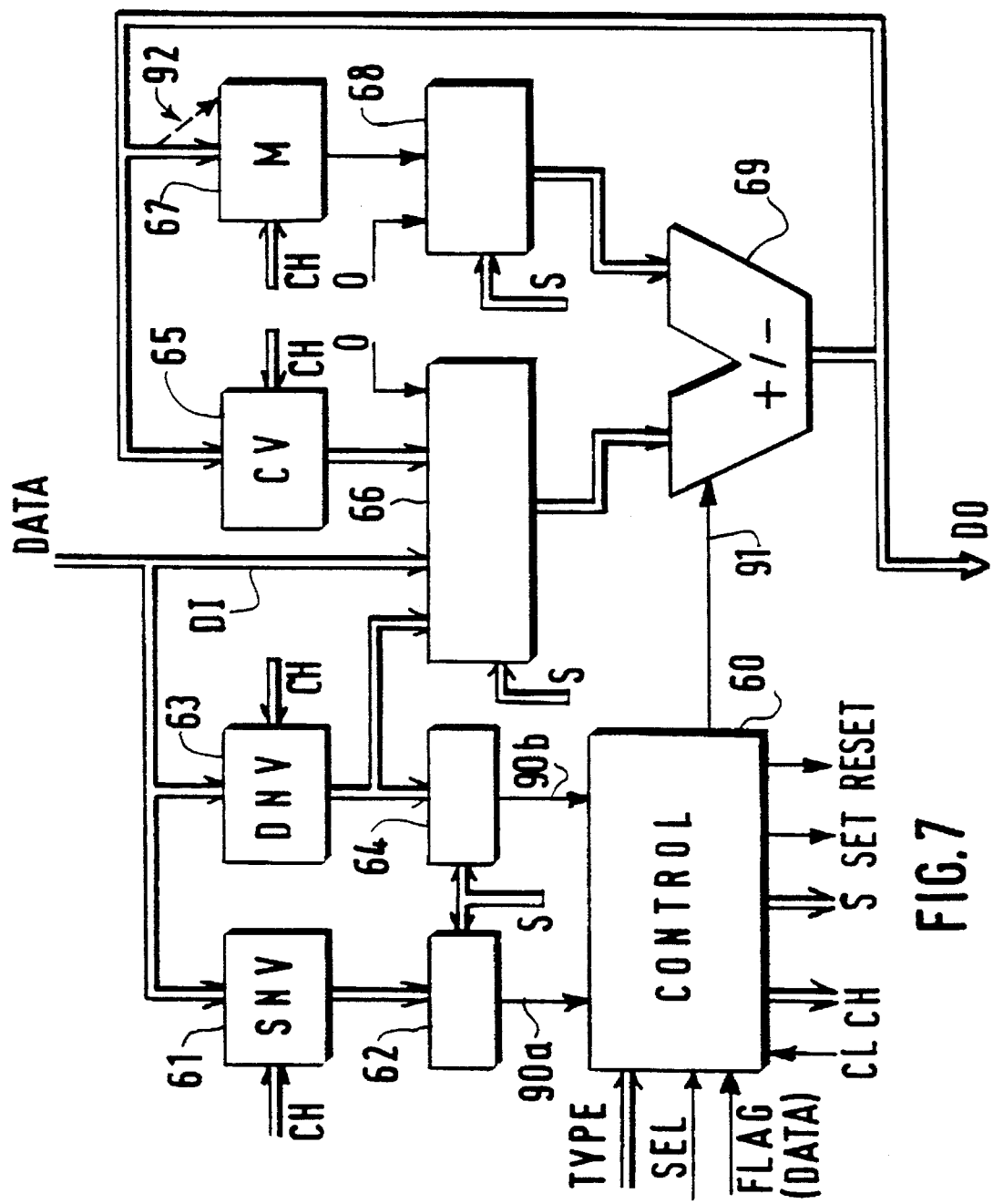
FIG. 7 shows a diagram of a processing module.

The various means of the synaptic cell 15 are shown in the FIGS. 5, 6 and 7.

The allocation means 31 are shown in FIG. 5. A register REG 312 stores a busy state (REG=1) or a free state (REG=0) of the synaptic cell. These free/busy states can be modified by commands SET/RESET from the processing means 35 (FIGS. 2 and 7).

An AND-gate 314 performs a logic AND-function between the output of the register 312 and the input signal BUSY I from the preceding synaptic cell. The output signal BUSY 0 is 1 when the input signal BUSY I is 1 (all preceding cells BUSY) and when REG is 1 (the synaptic cell 15 is busy). When BUSY I is 1 and REG is 0, the synaptic cell 15 is free and BUSY 0 is 0.

Only the first free synaptic cell in the chain has a signal BUSY I which is 1 and a signal BUSY 0 which is 0. This permits selection of the first free synaptic cell in order to perform the allocation operations.

During operation, the signal FR/OC supplied by the allocation means 31 controls the addressing means 33.

FIG. 6 shows the addressing means ADDR 33 for a synaptic cell relating to an arbitrary synapse characterizing the weighted connection between a source neuron and a destination neuron. The address bus ADR contains several data fields:

a field SID which is an identifier for the source neuron of the synapse or synapses involved in the instruction, a field DID which is an identifier for the destination neuron of the synapse or synapses involved in the instruction, two bits SF and DF which describe how the addressing is to take place. These two bits SF and DF produce a filtering signal SF and a filtering signal DF which can be independently activated so as to address either all synaptic cells connected to the same destination neuron or all synaptic cells connected to the same source neuron and which can also be simultaneously activated so as to address all synaptic cells.

The identifiers SID and DID are loaded into registers 51 and 53, respectively, during the allocation steps, under the control of the loading command CH (field comprising several bits) which is supplied by the processing means 35. At the end of the allocation phase for a synaptic cell, the identifiers SID and DID present on the bus become the allocated identifiers SNI and DNI, respectively, which are loaded into the registers 51 and 53, respectively. During use, current addresses are applied to the bus ADR. Comparators 52 and 54 then compare the allocated identifiers SNI and DNI with the identifiers SID and DID, respectively, contained in the current address.

For all instructions, except for the allocation instruction, an allocated synapse may be selected according to four modes which are specified by the bits SF and DF:

mode 1: unconditional selection (all synapses are concerned), mode 2: selection if SID=SNI (by the source neuron), mode 3: selection if DID=DNI (by the destination neuron), mode 4: selection if SID=SNI and DID=DNI (by the two neurons).

If the condition is satisfied in a given mode, the signal SEL supplied by the addressing means ADDR is in the active state.

In the opposite case, said signal SEL is set to the inactive state.

In the case of selection in conformity with the fourth mode, it is necessary that the two identifiers SNI and DNI have both been recognized. This is determined by an AND-gate 57 whose output is applied to a control unit 59. For the other selection modes, the outputs of the comparators 52 and 54 are applied to two OR-gates 55 and 56, respectively, which also receive the source filters SF and destination filters DF, respectively. The output signals of the OR gates 55, 56 are subsequently applied to the AND-gate 57.

The control unit 59 receives several data fields and several activation signals.

It receives:

the input signal BUSY I from the preceding synaptic cell, the busy signal FR/OC from the allocation means ALLOC of the current synaptic cell, the operation type field TYPE, the allocation bit "alloc" used during the allocation steps for said synaptic cell, the address coincidence signal (output signal of the AND-gate 57).

The control unit 59 performs the following control operations:

for the allocation instruction, the signal SEL is activated when:

the type of instruction is "synapse management" (Table I), the bit "alloc" of the field DATA is active, BUSY I=1 (activated) and FR/OC=0 (free) (this corresponds to the first free synaptic cell).

For the other instructions, the signal SEL is activated when:

the output signal of the AND-gate 57 is in the active state, the signal FR/OC is in the busy state (FR/OC=1).

The processing means PROCES 35 are shown in FIG. 7. They perform various operations on the data field DATA Which itself contains, depending on the type of instruction, different fields relating to the states of the source/destination neurons, to the synaptic coefficient, and to selection or loading commands.

A neural state SNV of the source neuron and a neural state DNV of the destination neuron are stored in registers 61 and 63, respectively. They may also include errors to be back-propagated in the course of learning steps by error back-propagation. The synaptic coefficient CV is stored in a register 65. A register 67 serves to store a result M, for example an accumulation obtained in the course of cyclical operations performed in a sequence of operations of the same nature.

Selectors 62, 64 enable bit-wise selection of the values of the neural states stored in the registers 61 and 63, respectively. Two selectors 66, 68 are provided for each of the inputs of an adder/subtractor 69.

The selector 66 makes a selection from the following data:

neural state DNV of the destination neuron, the input data field DI contained in the data field DATA, the synaptic coefficient CV, a value zero.

The selector 68 receives either the output signal of the register 67 or a value zero.

The adder/subtractor 69 supplies a result which may be reintroduced (with a possible shift of one bit to the right by a shifter 92) at the input of the register 67 in order to perform accumulations with the preceding values stored in M. At the end of a cycle of operations, the adder/subtractor 69 applies an output data field DO to the next synaptic cell. It appears that the data path DATA is interrupted by each synaptic cell which may either make its own contribution or operate as if transparent.

A control block 60 applies various control signals to the synaptic cell:

selection signals S (multi-bit field) to the selectors 62, 64, 67, 68, 92, the selection between "addition" or "subtraction" for the arithmetic unit (connection 91), loading signals CH (multi-bit field) to the registers 51, 53 (FIG. 6), 61, 63, 65, 67 (FIG. 7), signals SET, RESET to the register 312 (FIG. 5).

The control block 60 receives:

the clock signal CL wherefrom there are derived the loading signals and the signals SET and RESET, the selection signal SEL indicating that the synaptic cell is or is not involved in the operation, the operation type bus TYPE, given bits (FLAG) contained in the field DATA to enable positioning of the selectors and parameterizing of the adders/subtractors.

In order to perform either the allocation of a synaptic cell (SET=1) or its liberation (RESET=1), the control block 60 includes the allocation circuit shown in FIG. 4. A decoder 40 detects whether the synaptic cell is subject to an instruction of the type "synapse management".

When the synaptic cell is subject thereto, the output of the decoder 40 is activated. This output signal is applied, together with the bit FREE and the clock signal CL, to an AND-gate 42. When these three signals are simultaneously activated, the signal RESET (AND-gate 42) is activated.

The output signal of the decoder 40 is also applied, together with the bit "alloc" and the clock signal CL, to an AND-gate 41. When these three signals are simultaneously activated, the signal SET (AND-gate 41) is activated.

Various operations can be performed by the neural processor. They are carried out by way of a set of instructions:

salloc . . . allocation of synapses.

This instruction looks for the first free synapse, loads the identifiers of the source and destination neurons into this synapse, and declares the synapsis busy.

sfree . . . liberation of synapses.

This command liberates the synapse or synapses identified.

The latter instruction may concern several synapses simultaneously.

Other instructions are also performed within one and the same synaptic cell:

read: reading of a synaptic coefficient. Within the identified synaptic cell, this instruction causes the reading of the synaptic coefficient which will appear at the output of the neural processor at the end of the idle time. The selector 66 receives CV and the selector 68 receives 0 (FIG. 7). The adder/subtractor 69 then applies CV to the data bus DO in order to enable extraction of the synaptic coefficients stored. This is useful, for example after a learning phase.

write: writing of the values of neuron states and/or the synaptic coefficients. This instruction loads the value SNV, DNV, CV or M into the registers 61, 63, 65, 67 when the appropriate command is activated (field CH).

accu: accumulation of the contributions of the synapses. This command enables the summing of the contributions of the synapses. The synaptic cells involved add the contents of their accumulator M to the input partial sum and apply the result to the next synaptic cell. Depending on the values of the source filter SF and the destination filter DF, the following results are obtained:

1. SF=0, DF=0: not used

2. SF=1, DF=0: all synapses downstream from a neuron are concerned. This combination is used for backpropagating the errors in the learning phase.

3. SF=0, DF=1: all synapses upstream from a neuron are concerned. This combination is used during the evaluation phase so as to calculate the potential of a neuron.

4. SF=1, DF=1: reading of the contents of the accumulator of a specific synaptic cell.

alu . . . internal arithmetic operation multi . . . single-bit-multiplications.

This instruction enables accumulation of a partial product of a multiplication of a multiplicand by a multiplier bit. This is a primitive of the multiplication with integers with a sign, which will be realised by a succession of as many instructions multi as there are bits in the multiplier. The first instruction loads M with the first partial product shifted towards the right. The subsequent instructions add the new partial product to the contents of M, while reloading the result shifted to the right in M. The last instruction performs a subtraction instead of an addition, and reloads the result without shifting.

The selectors 62 and 64 extract, from the registers SNV and DNV, the bits (connections 90a and 90b) corresponding to the rank specified in the instruction. Depending on the choice of the multiplier and the multiplicand specified in the instruction and as a function of the bits present on the connections 90a and 90b, the selector 66 is positioned either to DNV or to CV or to 0. The arithmetic unit adds or subtracts, depending on the specification of the instruction, the output signal of the selector 66 to or from that of the selector 68. Finally, the result is reloaded into the register M, with or without shifting to the right by 1 bit, again under the control of the instruction.

The neural processor can thus be programmed to allocate the source and destination neurons to any synaptic cell. Their numbers may be dynamically modified. It is possible to program types of operation concerning resolution phases during which the neuron state registers are loaded with the neuron states, or concerning the learning phases during which the neuron state registers are loaded with errors to be backpropagated.

As is indicated in FIG. 3, the neural processor may be formed by a linear chain of synaptic cells. An input synaptic cell receives all information: (control+addresses+data), possibly makes its own contribution, and applies, via the concatenated paths, the information (modified or not) to the next synaptic cell. When a synaptic cell is not involved, it relays to the next synaptic cell.

After an idle period, a stream of results appears at the output of the last synaptic cell of the chain. This stream must be read at the appropriate rate so as to be used.

If the instruction implies modifications of registers, a clock signal CL is applied at the end of the idle time, so that all registers involved are simultaneously loaded.

Further Embodiment

Figure 8:
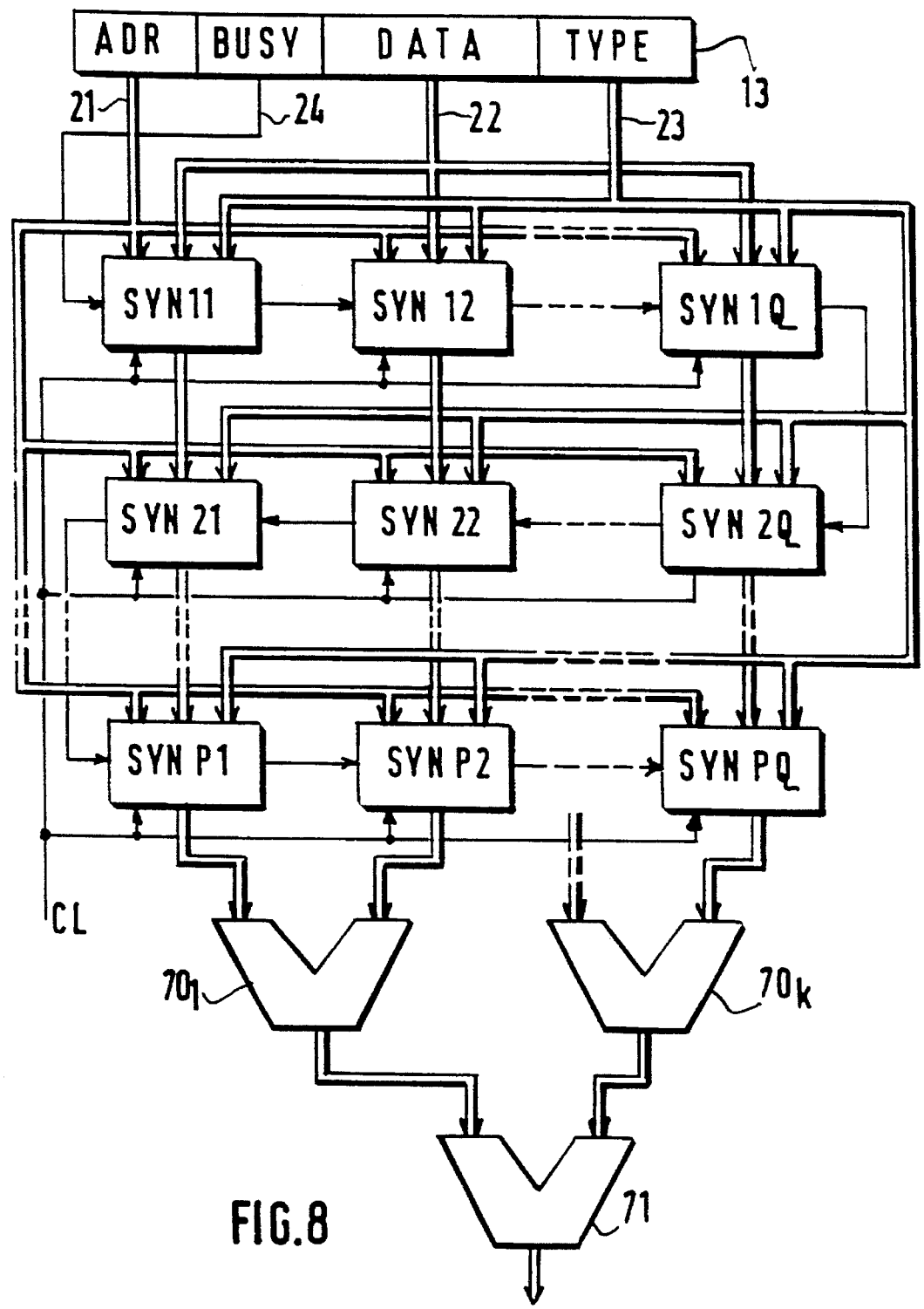
FIG. 8 shows a general diagram of a neural processor comprising a plurality of synaptic cells subdivided into several ordinate groups of synaptic cells.

In order to reduce the idle time, the plurality of synaptic cells may be subdivided into several parallel groups of synaptic cells (FIG. 8). For example:

a first group SYN 11, SYN 21, . . . SYN P1, a second group SYN 12, SYN 22, . . . SYN P2, a third group SYN 1Q, SYN 2Q, . . . SYN PQ.

Each group is implemented in the same manner as already shown in FIG. 3:

the communications in parallel, via the bus ADR and via the bus TYPE, take place in parallel for all groups, the concatenated path BUSY extends through all synaptic cells, first through all first synaptic cells of each group, subsequently through all second synaptic cells of each group, and finally through all last synaptic cells, the concatenated path DATA is subdivided between all groups. The communication thus takes place in parallel via all groups of synaptic cells. It continues as a concatenated path within a group. In the case of an accumulation instruction, the field DATA is applied only to one group, the other groups receiving 0.

The results supplied by the last synaptic cells SYN P1, SYN P2, . . . SYN PQ of each group are accumulated in an adder tree which is formed, for example, by several cascade-connected adders $70_1, 70_k, 71$ in the case of an accumulation instruction. For the other instructions, steps are taken so as to neutralize these adders so that they cannot alter the contents of the paths DATA.

Alternate Embodiment

Figure 9:
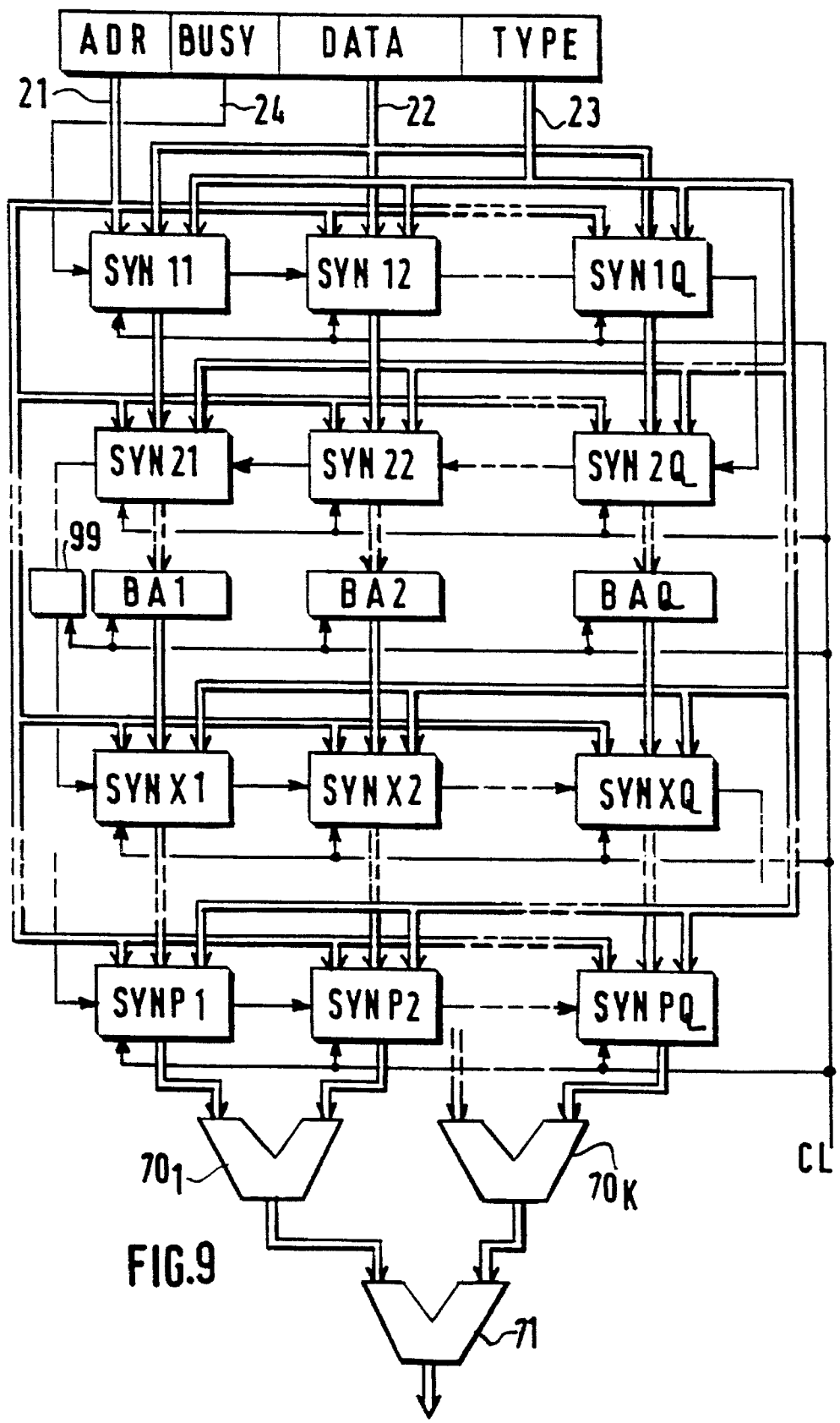
FIG. 9 shows a diagram, analogous to that shown in FIG. 8, with pipeline barriers.

The cycle duration can be reduced by inserting pipeline barriers in each group as shown in FIG. 9. These pipeline barriers, being formed by registers BA1, BA2, . . . BAQ, are arranged in the data path subsequent to a given number of synaptic cells forming a section. Thus, within one and the same group a section may be subject to accumulation operations in the course of a pipeline cycle, while another section is subject to write operations. For reasons of synchronization, between two pipeline barriers each section preferably contains the same number of synaptic cells. The loading of the registers BA1, BA2, . . . BAQ is triggered by the clock signal CL.

The use of the pipeline necessitates an adaptation of the device for the execution of the allocation function. Actually, if the circuit were not to be modified, a single allocation instruction supplied via the circuit would cause as many allocations as there are segments (set of sections of the same rank of each group), which is not the desired result. In order to eliminate this problem, the first allocation, performed in the first segment where the conditions are satisfied, blocks the allocations, if any, taking place in the subsequent segments. Therefore, the pipeline barrier also includes a register 99 which interrupts, in synchronism with the other registers, the chain of the signal BUSY. Beyond the pipeline barrier, the chain BUSY continues with the first rank of the synaptic cells of the next section of each group (SYN X1, SYN X2, . . . SYN XQ).

The supply of the information on the bus 9, arriving at the input means 13, and the supply of the clock signal CL (FIG. 3) can be realised by means of a host computer (not shown) which may also execute synchronization operations by identifying the completion of the instructions. A new instruction is then supplied by the host computer when an instruction applied to the input is detected at the output of the neural processor. In the pipeline mode, where no dependence exists between two successive instructions, the host computer supplies the next instruction during the next pipeline cycle. In the case of dependence, the host computer awaits the end of the instruction at the output of the neural processor. The instructions may concern execution tasks as well as learning tasks.

I claim:

1. A neural processor (10) comprising:

a) input means for inputting digital signals;

b) a first plurality of storage means for storing synaptic coefficients, each synaptic coefficient defining a strength of a respective synapse connecting a respective pair of neurons;

c) a second plurality of storage means for storing neuron states;

d) an address bus (21);

e) an operation type bus (23);

f) at least one linked data path (22) for propagating data;

g) at least one free/busy path (24a, 24b) for propagating a free/busy signal; and h) a plurality of means for computing neural potentials, comprising a plurality of synaptic cells, each synaptic cell being devoted to a respective one of the synapses, the synaptic cells being coupled in parallel to receive input signals from the address bus and the operation type bus, the synaptic cells being arranged in a chain, connected from one cell to another along the linked data path and the free/busy path, each respective synaptic cell comprising:

i) respective allocating means (31) for allocating, to the respective synaptic cell, a free/busy state propagated by the linked free/busy path;

ii) respective addressing means (33) for

A) storing an address identifying the respective synaptic cell, the address comprising a source neuron identifier (51) and a destination neuron identifier (53), and B) comparing the address to a current address (SID, DID) appearing on the address bus (21) for determining whether the respective synaptic cell should be activated; and iii) respective processing means (35) for performing operations, defined by the operation type bus (22), on data received from the linked data path (22).

2. Neural processor of claim 1 wherein the address bus carries a first filtering signal (SF) and a second filtering signal (DF) which can be independently activated for addressing, respectively, either all the synaptic cells connected to a sole destination neuron or all the synaptic cells connected to a sole source neuron, and which first and second filtering signals can be simultaneously activated for addressing all the synaptic cells.

3. Neural processor of claim 2 wherein the plurality of synaptic cells is divided up in ordered groups of synaptic cells, each group having a respective linked data path.

4. Neural processor of claim 3 wherein, for each ordered group, each synaptic cell has a queue number, the linked free/busy path going through synaptic cells that have, in each ordered group, an identical queue number and then synaptic cells having an identical following queue number until all synaptic cells are reached according to either an increasing or a decreasing progression.

5. Neural processor of claim 3 further comprising at least one pipeline barrier; and wherein the ordered groups are divided up by pieces collected in sections, which sections are separated from one another by the pipeline barrier, pieces of sections adjoining a same pipeline barrier having an identical number of synaptic cells.

6. Neural processor of claim 1 wherein the plurality of synaptic cells is divided up in ordered groups of synaptic cells, each group having a respective linked data path.

7. Neural processor of claim 6 wherein, for each ordered group, each synaptic cell has a queue number, the linked free/busy path going through synaptic cells that have, in each ordered group, an identical queue number and then synaptic cells having an identical following queue number until all synaptic cells are reached according to either an increasing or a decreasing progression.

8. Neural processor of claim 6 further comprising at least one pipeline barrier; and wherein the ordered groups are divided up by pieces collected in sections, which sections are separated from one another by the pipeline barrier, pieces of sections adjoining a same pipeline barrier having an identical number of synaptic cells.

9. Neural processor of claim 7 further comprising at least one pipeline barrier; and wherein the ordered groups are divided up by pieces collected in sections, which sections are separated from one another by the pipeline barrier, pieces of sections adjoining a same pipeline barrier having an identical number of synaptic cells.

* * * * *